(12) United States Patent
Shimazaki et al.

(10) Patent No.: US 6,244,493 B1
(45) Date of Patent: Jun. 12, 2001

(54) DIE BONDING APPARATUS

(75) Inventors: Eiichi Shimazaki, Kokubunji; Tsutomu Sugimoto, Iruma; Toshihiro Naoi, Musashimurayama; Osamu Nakamura, Kokubunji; Noboru Fujino, Musashimurayama, all of (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 09/110,919

(22) Filed: Jul. 6, 1998

(30) Foreign Application Priority Data

Jul. 9, 1997 (JP) .................................. 9-199321

(51) Int. Cl.⁷ .............................. B23K 37/00; B23K 5/00
(52) U.S. Cl. ............................ 228/5.5; 228/5.5; 228/6.2; 29/743
(58) Field of Search ................... 228/6.2, 106; 269/903; 29/840

(56) References Cited

U.S. PATENT DOCUMENTS

| | | | | |
|---|---|---|---|---|
| 4,203,064 | * | 5/1980 | Suzuki et al. | 318/640 |
| 4,550,374 | * | 10/1985 | Meshman | 364/490 |
| 4,682,396 | * | 7/1987 | Leonov | 29/271 |
| 4,848,639 | * | 7/1989 | Belanger | 228/5.5 |
| 4,875,614 | * | 10/1989 | Cipolla et al. | 228/5.5 |
| 4,878,610 | * | 11/1989 | Mori et al. | 228/6.2 |
| 4,899,921 | * | 2/1990 | Bendat et al. | 228/105 |
| 5,316,276 | * | 5/1994 | Heinle | 269/21 |
| 5,504,437 | * | 4/1996 | Hirae et al. | 324/765 |
| 5,518,360 | * | 5/1996 | Toda et al. | 414/755 |
| 5,799,858 | * | 9/1998 | Nam et al. | 228/6.2 |

FOREIGN PATENT DOCUMENTS

| | | | | |
|---|---|---|---|---|
| 50-102268 | * | 8/1975 | (JP) | 228/6.2 |
| 55-48942 | * | 4/1980 | (JP) | 228/6.2 |
| 56-51322 | * | 12/1981 | (JP) | 228/6.2 |
| 404291799 | * | 10/1992 | (JP) | 228/5.5 |
| 4-312936 | * | 11/1992 | (JP) | 228/6.2 |
| 405326577 | * | 12/1993 | (JP) | 228/5.5 |
| 62-136019 | * | 12/1993 | (JP) | 228/6.2 |
| 7-211733 | * | 8/1995 | (JP) | 228/6.2 |
| 11026482A | * | 2/1999 | (JP) | 228/6.2 |

* cited by examiner

Primary Examiner—Patrick Ryan
Assistant Examiner—Lynne Edmondson
(74) Attorney, Agent, or Firm—Koda & Androlia

(57) ABSTRACT

In a die bonding apparatus with a position correcting stage that has a die carrying surface upon which a die is placed by a collet, the external circumferential shape of the die carrying surface of the position correcting stage is formed so as to be smaller than the external circumferential shape of the die to be carried on the die carrying surface, thus avoiding damages to the surface of the die.

7 Claims, 2 Drawing Sheets

DIE BONDING APPARATUS

BACKGROUND OF THE INVENTION

1. Field of the Invention

The present invention relates to a die bonding apparatus equipped with a position correcting stage which corrects the position of a die to be placed thereon.

2. Prior Art

In a die bonding apparatus, a die is picked up from a wafer or tray by way of vacuum-chucking performed by a collet which is installed in a die conveying device; and the die is conveyed and placed on a position correcting stage. When the die is placed on the position correcting stage, the position (attitude) of the die is corrected by the position correcting stage. So as to prevent excessive forces or shocks from being applied to the die when the die is chucked and placed on the position correcting stage by the collet, the collet is made of a rubber or urethane material, etc. and conforms to the shape of the die. On the other hand, the die carrying surface of the position correcting stage is made of metal; and when the die is to be placed on this surface, the collet that chucks the die is moved to a point above the die carrying surface and then lowered at a slow speed, releasing the die on the die carrying surface.

Die bonding apparatuses of this type are described in, for instance, Japanese Patent Application Laid-Open (Kokai) Nos. S50-102268, S55-48942, H4-312936, and H7-211733. Japanese Utility Model Application Laid-Open (Kokai) No. S56-126844 and Japanese Utility Model Application Publication (Kokoku) No. S56-51322, etc. also disclose the above-described types of die bonding apparatuses.

In these die bonding apparatuses, if a die is inclined with respect to the die carrying surface when the die is about to be placed on the die carrying surface, the corner portions of the die may contact the die carrying surface, causing cracking and chipping in the die. Accordingly, so as to avoid this, an adjustment operation known as "parallel positioning" is performed. In this parallel positioning, the tip end surface of the collet of the die conveying device (that contacts the die) and the die carrying surface are brought so as to be parallel to each other.

The parallel positioning adjustment is generally performed in the following manner:

(1) A pressure-sensitive paper which changes color at the point where the pressure is applied is set on the die carrying surface. In this case, so as to bring the collet and pressure-sensitive paper into contact with each other, the height of the die carrying surface is raised by an amount equal to the thickness of the die+$\alpha$ ($\alpha$ is the amount of pressure used to cause a transfer to the pressure-sensitive paper), or the height position of the collet, at the time when the die is placed on the die carrying surface, is lowered by an amount equal to the thickness of the die+$\alpha$.

(2) The die conveying device is operated so that the same operation as that performed when a die is actually placed on the die carrying surface is performed. With this operation, the points of contact on the collet is transferred to or marked on the pressure-sensitive paper.

(3) The inclination of the collet, if any, is adjusted so that the shape duplicated on or transferred to the pressure-sensitive paper is a more or less uniform shape.

(4) The operations of (1) through (3) are repeated until the shape of the collet is uniformly transferred to the pressure-sensitive paper.

Thus, in the prior art, the shape of a collet is acquired (transferred) by means of pressure-sensitive paper when the parallel positioning adjustment operation is performed. Accordingly, the height of the position correcting stage must be raised or lowered beforehand; and therefore, the position correcting stage must be returned to its original position after the adjustment.

In the meantime, the amount the position correcting stage is raised or the amount the height of the collet is lowered must be an amount which is sufficient to obtain a clear transfer of the shape of the collet to the pressure-sensitive paper. Accordingly, an appropriate pressure needed for the transfer (that corresponds to the above-described $\alpha$) cannot be obtained unless the operations (1) through (3) are repeated several times.

In addition, the sensitivity of the pressure-sensitive paper is generally not quite accurate; and even if the transferred shape appears to be uniform, there is actually still a considerable amount of inclination of the collet in most cases.

If cracking or chipping occurs in the die even though the above-described adjustment operation of (1) through (3) is performed, then it is necessary to perform a further adjustment which would prevent cracking or chipping according to the experience and intuition of the operator and to conduct test bonding; and this operation is repeated until favorable results are obtained. Thus, numerous dies and lead frames, etc. are consumed in the test bonding which are eventually wasted.

As seen from the above, in the prior art, the operating characteristics are poor and considerable experience is required.

SUMMARY OF THE INVENTION

Accordingly, the object of the present invention is to provide a die bonding apparatus which is superior in terms of operating characteristics, which can perform parallel positioning in a simple manner without any need for the experience of an operator, and which can avoid cracking or chipping in the dies.

The above objects of the present invention is accomplished by a unique structure for a die bonding apparatus equipped with a position correcting stage which corrects the position of the die, and in this die bonding apparatus the external circumferential shape of the die carrying surface of the position correcting stage is set to be smaller than the external circumferential shape of the die that is to be placed on the die carrying surface.

In the above structure, the position correcting stage is comprised or a stage main body and a die carrier which is detachably attached to the stage main body and has a die carrying surface on which the die is placed.

Furthermore, an engaging recess is formed in either the stage main body or the die carrier, and an engaging projection which engages with the engaging recess is formed on the other of such two elements, thus assuring a secure engagement of the stage main body and the die carrier.

In addition, a shock-absorbing material such as a hard rubber, plastic or the like is provided on the die carrying surface of the die carrier.

Further, a curvature is formed along the edge portions of the die carrying surface of the die carrier.

DETAILED DESCRIPTION OF THE PREFERRED EMBODIMENTS

Figure 1:
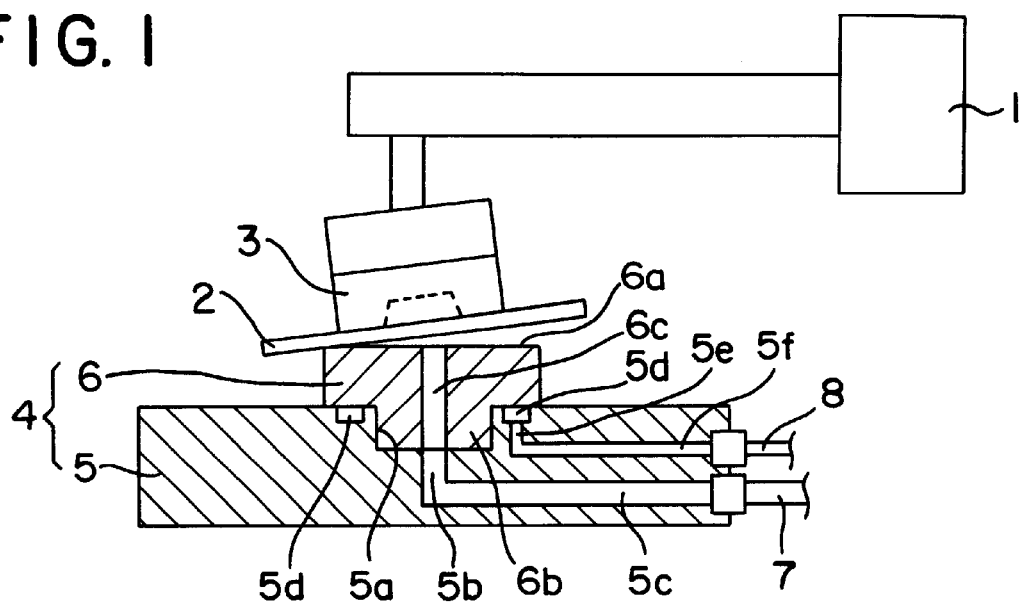
FIG. 1 is a partially sectional front view which illustrates the position correcting stage used in the embodiment of die bonding apparatus of the present invention.

Preferred embodiments of the present invention will be described with reference to FIGS. 1 through 4.

The die conveying device 1 has a collet 3 which vacuum-chucks a die 2. The collet 3 vacuum-chucks the die 2 from a wafer or tray (not shown) and conveys and places the die 2 on a position correcting stage 4.

The position correcting stage 4 comprises a stage main body 5 and a die carrier 6 which is made of, for instance, cemented carbide or hard metal, and held in place on this stage main body 5 by vacuum suction as will be described below. The external circumferential shape of the die carrying surface 6a of the die carrier 6 is formed so as to be smaller than the external circumferential shape of the die 2. In other words, when the die carrier 6 has a round die carrying surface 6a, then the die carrying surface 6a is smaller in diameter than the diameter of the die 2.

Furthermore, an engaging recess 5a is formed in the central portion of the stage main body 5, and an engaging projection 6b which engages with this engaging recess 5a in a freely detachable manner is formed on the die carrier 6. Instead, the engaging recess can be formed in the die carrier 6 with an engaging projection which engages with the engaging recess formed in the stage main body 5

A first suction passage 5b is formed in the stage main body 5 so as to open in the engaging recess 5a. This first suction passage 5b runs downward; and a second suction passage 5c extends from the lower end of the first suction passage 5b and runs toward the side wall of the stage main body 5 so that one end of a die suction pipe 7 is connected to this second suction passage 5c. The other end of the die suction pipe 7 is connected to a vacuum source (not shown). The die carrier 6 is formed with a third suction passage 6c which is to communicate with the first suction passage 5b.

Figure 2:
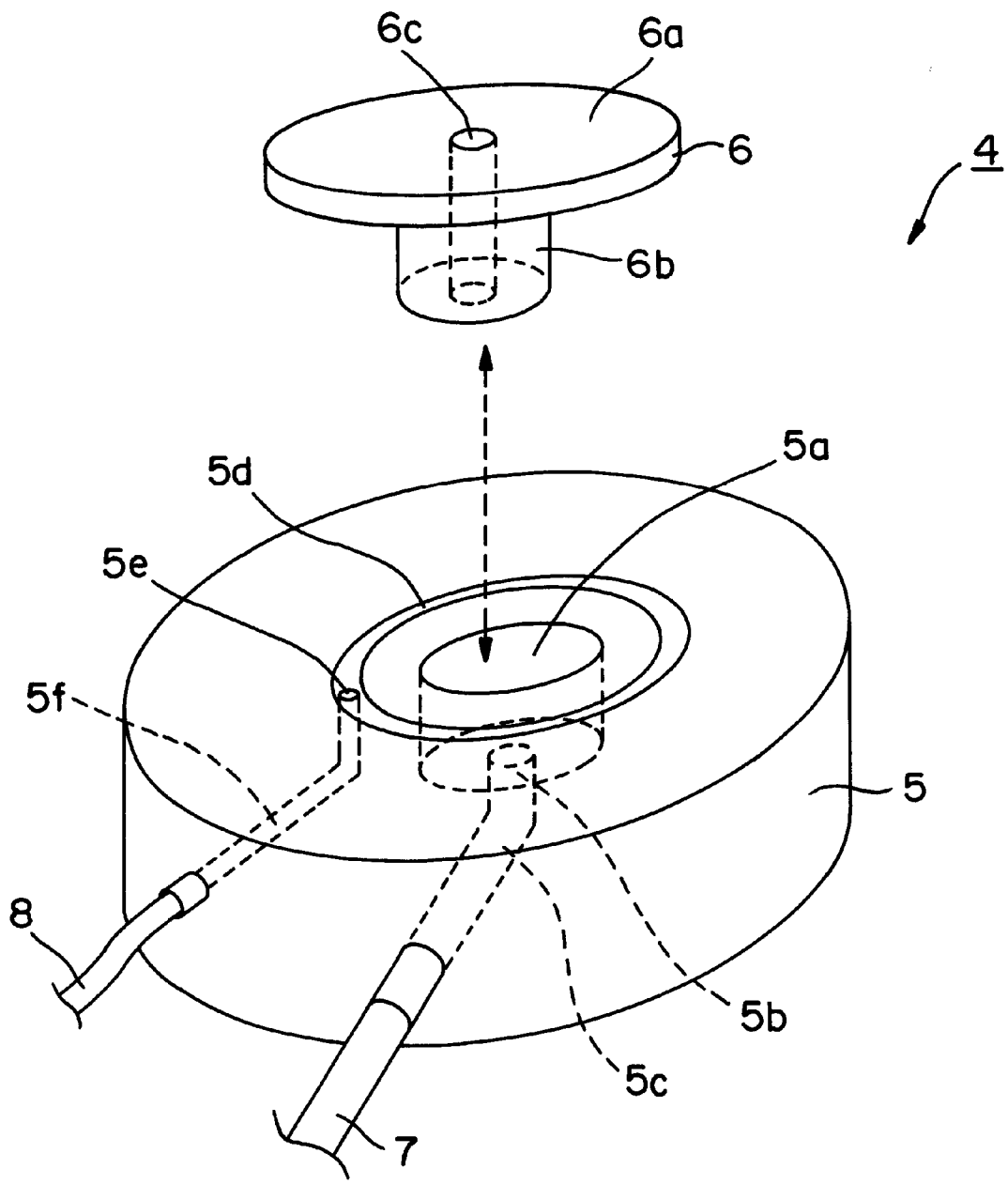
FIG. 2 is an exploded perspective view of the position correcting stage.

As best seen from FIG. 2, an annular suction groove 5d is formed in the upper surface of the stage main body 5. The annular suction groove 5d is smaller than the outer circumference of the die carrier 6. A first suction path 5e which runs downward is formed stage main body 5 and opens in the suction groove 5d; and a second suction path 5f extends from the lower end of this first suction path 5e and runs toward the side wall of the stage main body 5 so that one end of a die carrier suction pipe 8 is connected to the second suction path 5f. The other end of this die carrier suction pipe 8 is connected to a vacuum source (not shown).

As seen from the above, the external circumferential shape of the die carrying surface 6a of the die carrier 6 is smaller than the external circumferential shape of the die 2, the corner portions of the die 2 are prevented from contacting the die carrying surface 6a of the die carrier 6 when the die 2 is placed on this die carrying surface 6a by the collet 3, even if the tip end surface (or the under surface in FIG. 1) of the collet 3 that suction-holds the die 2, is not completely parallel to the die carrying surface 6a. In other words, since an inside portion of the die 2 (and not the outer circumferential edge portions) comes into contact with the die carrier 6 when the under surface of the collet 3 is not parallel to the die carrying surface 6a, the concentration of stress is alleviated, and cracking or chipping is prevented from occurring in the die 2.

When the engaging projection 6b of the die carrier 6 is brought into engagement with the engaging recess 5a of the stage main body 5 and the vacuum of the die carrier suction pipe 8 is turned on, the die carrier 6 is fastened to the stage main body 5 by vacuum suction. When the vacuum of the die carrier suction pipe 8 is turned off, the die carrier 6 can be removed from the stage main body 5. Thus, when there is a change in the size of the die 2, the die carrier 6 can easily be replaced.

Figure 3:
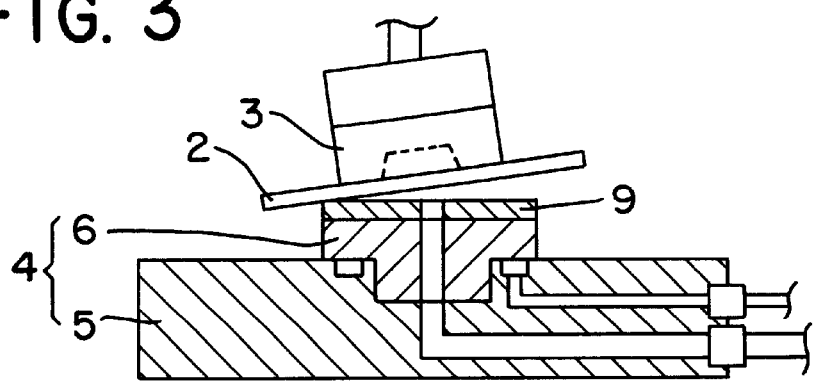
FIG. 3 is a partially sectional front view of the position correcting stage employed in another embodiment of the die bonding apparatus of the present invention.
Figure 4:
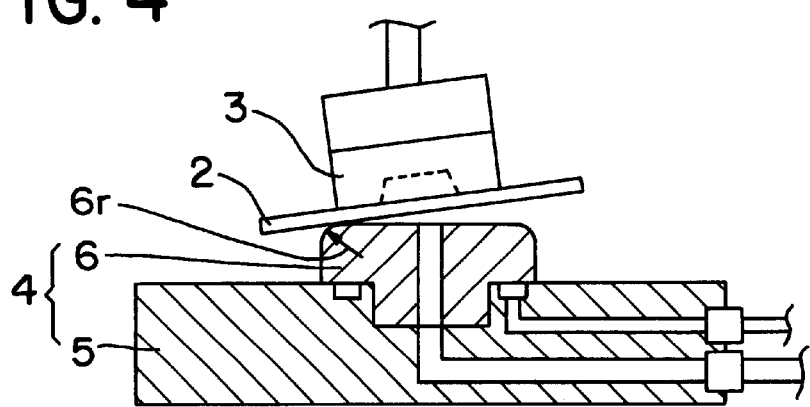
FIG. 4 is a partially sectional front view of the position correcting stage employed in still another embodiment of the present invention.

In the above structure, there is a danger that the undersurface of the die 2 may be scratched by the edge portions of the die carrier 6. This can be prevented by installing a shockabsorbing material 9 such as a hard rubber, plastic material, etc. on the die carrying surface 6a of the die carrier 6 as shown in FIG. 3, or by forming a curvature 6r on the edge portions of the die carrier 6 (or the edge portions of the die carrier 6 is rounded). In other words, scratching of the undersurface of the die 2 is prevented by the shock-absorbing material 9 or by the curvature 6r. When the shock-absorbing material 9 is used, the die 2 can slip on the surface of the shockabsorbing material 9; thus scratching of the die is further less likely to occur. It is further possible to form the entire die carrier 6 from shock-absorbing material such as a hard rubber, plastic material, etc.

As seen from the above, according to the present invention, the external circumferential shape of the die carrying surface of the die position correcting stage is made smaller than the external circumferential shape of the die which is to be placed thereon. Accordingly, the present invention is superior in terms of operating characteristics. Furthermore, with the present invention, parallel positioning is performed in a simple manner without any need for the experience of an operator, and no cracking or chipping occurs in the dies. Moreover, since the position correcting stage comprises a stage main body and a die carrier which is removably attached to the stage main body and has a die carrying surface on which the die is placed it is possible to replace the die carrier in accordance with the size of the die to be handled. Furthermore, scratching on the surface of the die that might occur when the die is placed on the die carrying surface of the die carrier is prevented because a shock-absorbing material such as a hard rubber, plastic material, etc. is provided on the die carrying surface or a curvature is formed along the edge portions of the die carrying surface of the die carrier.

What is claimed is:

1. A die bonding apparatus equipped with a position correcting stage which has a die carrying surface for placing thereon dies conveyed by a die conveying device and corrects the position of a die that is placed on said die carrying surface, wherein an external circumferential shape of said die carrying surface of said position correcting stage is formed smaller than an external circumferential shape of a die which is placed on said die carrying surface.

2. A die bonding apparatus according to claim 1, wherein said position correcting stage comprises a stage main body and a die carrier which is attached to said stage main body in a detachable manner and has said die carrying surface on which said die is placed.

3. A die bonding apparatus according to claim 2, wherein an engaging recess is formed in either one of said stage main body and said die carrier, and an engaging projection which engages with said engaging recess is formed on another of said stage main body and said die carrier.

4. A die bonding apparatus according to claim 2, wherein said die carrying surface of said die carrier comprises a shock-absorbing material.

5. A die bonding apparatus according to claim 3, wherein said die carrying surface of said die carrier comprises a shock-absorbing material.

6. A die bonding apparatus according to claim 2, wherein a curvature is formed along edge portions of said die carrying surface of said die carrier.

7. A die bonding apparatus according to claim 3, wherein a curvature is formed along edge portions of said die carrying surface of said die carrier.

\* \* \* \* \*

UNITED STATES PATENT AND TRADEMARK OFFICE
CERTIFICATE OF CORRECTION

PATENT NO. : 6,244,493 B1
DATED : June 12, 2001
INVENTOR(S) : Eiichi Shimazaki et al.

It is certified that error appears in the above-identified patent and that said Letters Patent is hereby corrected as shown below:

<u>Column 4,</u>
Line 49, after "device," insert -- with said dies being suctioned held --.
Line 55, change "according to clam 1, wherein" to
-- equipped with a position correcting stage which has a
die carrying surface for placing thereon dies conveyed by a
die-conveying device with said dies being suction held and
corrects position of a die that is placed on said die
carrying surface, wherein, an external circumferential shape
of said die carrying surface of said position correcting
stage is formed smaller than an external circumferential
shape of a die which is placed on said die carrying surface
and --.

Signed and Sealed this

Fourth Day of June, 2002

Attest:

JAMES E. ROGAN
Attesting Officer     Director of the United States Patent and Trademark Office